United States Patent
Jeong et al.

(10) Patent No.: US 6,833,120 B2
(45) Date of Patent: Dec. 21, 2004

(54) SUPPLYING AND EXHAUSTING SYSTEM IN PLASMA POLYMERIZING APPARATUS

(75) Inventors: Young-Man Jeong, Kyungsangnam-Do (KR); Su-Won Lee, Kyungsangnam-Do (KR); Dong-Sik Youn, Kyungsangnam-Do (KR)

(73) Assignee: LG Electronics Inc., Seoul (KR)

( * ) Notice: Subject to any disclaimer, the term of this patent is extended or adjusted under 35 U.S.C. 154(b) by 24 days.

(21) Appl. No.: 10/220,778

(22) PCT Filed: Mar. 2, 2001

(86) PCT No.: PCT/KR01/00321

§ 371 (c)(1),
(2), (4) Date: Dec. 9, 2002

(87) PCT Pub. No.: WO01/66823

PCT Pub. Date: Sep. 13, 2001

(65) Prior Publication Data

US 2003/0143134 A1 Jul. 31, 2003

(30) Foreign Application Priority Data

Mar. 6, 2000 (KR) ......................... 2000/11004

(51) Int. Cl.[7] .............................................. B01J 19/08
(52) U.S. Cl. ............................................... 422/186.05
(58) Field of Search ....................... 422/186.05, 186.06

(56) References Cited

U.S. PATENT DOCUMENTS 6,342,187 B1 * 1/2002 Jacob et al. ........... 422/186.05

FOREIGN PATENT DOCUMENTS

| JP | 63-129630 | 6/1988 | ........... H01L/21/31 |
| JP | 06-041214 | 2/1994 | ............. C08F/2/52 |
| JP | 11-128634 | 5/1999 | ........... B01D/39/16 |
| JP | 11-209484 | 8/1999 | .............. C08J/5/24 |

OTHER PUBLICATIONS

English translation of JP 11–128634.*
English translation of Office Action issued by Chinese Patent Office on corresponding application No. 01806109.5 dated Jan. 30, 2004.
English translation of Abstract for cited Japanese reference application No. 11–209484.

* cited by examiner

Primary Examiner—Steven Versteeg
(74) Attorney, Agent, or Firm—Birch, Stewart, Kolasch & Birch, LLP

(57) ABSTRACT

A plasma polymerizing apparatus is provided which comprises at least one chamber in which sheet to be coated can be moved continuously, at least one gas inlet supplying reactive gas into the chamber, and at least one gas outlet exhausting the reactive gas out of the chamber, wherein the gas inlet and the gas outlet are disposed on the chamber in such a way that reactive gas flows in substantially parallel with moving direction of the sheet.

23 Claims, 5 Drawing Sheets

SUPPLYING AND EXHAUSTING SYSTEM IN PLASMA POLYMERIZING APPARATUS

TECHNICAL FIELD

The present invention relates to a supplying and exhausting system for a plasma polymerizing apparatus and particularly, to a supplying and exhausting system for a plasma polymerizing apparatus in which gas is supplied and exhausted in the same direction of the flow of a substrate coated by plasma polymerizing.

BACKGROUND ART

If a surface of a substrate such as a steel plate is coated with a thin film using plasma, a stratum tectorium having good consistency and abrasion resistance is formed. Products having the stratum tectorium are used as a magnetic disk, optical disk, carbide tool and the like. Also, if the paint-coated film generated on the surface of a steel plate is undergone plasma processing, an unplasticized paint coated steel plate having good durability and corrosion resistance. Particularly, through the processing, quality of the surfaces can be improved increasing hydrophile and hydrophobe by polymer polymerizing the surface of the substrate, and the improved substances are widely in use.

As an example, FIG. 1 is a sectional view showing an apparatus which can perform plasma polymerizing processing. Particularly, the apparatus is advantageous to coat thin film on a substrate with a great area. Also, an opposite electrode is positioned on the both sides of the substrate electrode and simultaneous polymerizing is possible thus to improve productivity. In the apparatus, the substrate 2 wound as a form of a roll is continuously fed from the unwinding chamber to the polymerizing chamber 1 and after polymerizing processing of the surface of the substrate in the polymerizing chamber, the substrate 2 is fed to the winding chamber 10 then wound in the form of a roll. The reactive gas is supplied through the reactive gas inlet 7 to the chamber maintained a certain vacuum status and plasma is generated by allowing power in the opposite electrode 4 on the upper and lower surface of the substrate. In case plasma discharge is generated in the chamber, the reactive gases in which molecular binding is broken and then the broken chains and activated cations and anions are combined to form polymerized material. On one side of the chamber, outlet 8 of the reacted gas is installed.

For this continuous processing apparatus, in case the gas inlet and gas outlet are installed in the polymerizing chamber, conventionally, the array relation is not specially considered and they are positioned so that the gas flow is formed in the vertical direction with the flow of the substrate in the polymerizing. Namely, in FIG. 1, the gas inlet 7 and outlet 8 are positioned at the left and right ends of the lower portion of the polymerizing chamber.

However, in positioning of the conventional gas inlet and outlet, there are disadvantages as follows. Firstly, gas flow in the polymerizing chamber is formed in the vertical direction with the flow of the substrate and accordingly, the reactive gas and the substrate can not react to each other sufficiently since the reactive gases stay for a short time. Secondly, gas flow in the polymerizing chamber is not formed uniformly as a whole thereof sufficient polymerizing can not be performed since the gas and substrate react in some area only. Due to the problems, the surface characteristic of the polymerized substrate is not uniform and defective products having desirable characteristics increase.

Also, in case of a continuous polymerizing apparatus, post-processing chamber can be additionally installed for post-processing after the polymerizing processing. In this case, the exhaust port of the gas inlet should be installed in the respective chambers. In case the gas inlet and exhaust port are installed, to control each gas in inconvenient and the facility becomes more complicated thus to cause main problems. Therefore, a plasma polymerizing apparatus is necessary to control gas supply and exhaust simply and easily.

SUMMARY THE PRESENT INVENTION

Therefore, an object of the present invention is to provide a plasma polymerizing apparatus which increases the time reactive gas stays on the surface of the substrate and enables efficient use of the reactive gas in the polymerizing chamber.

Another object of the present invention is to provide a plasma polymerizing apparatus with a simpler component to control gas supply and exhaust smoothly.

To achieve the objects, the present invention provide a supplying and exhausting system for a plasma polymerizing apparatus having a polymerizing chamber capable of moving a substrate continuously in which gas inlet for supplying gas to a polymerizing chamber and a gas outlet for exhausting reactive gas supplied through the gas inlet and wherein the gas inlet and outlet are installed so that the reactive gas flows in substantially parallel with the moving direction of the substrate.

The polymerizing chamber includes a vertical chamber in which a substrate moves horizontally and vertically.

BRIEF DESCRIPTION OF THE DRAWINGS

FIG. 2b is a front sectional views showing a supplying and exhausting system of FIG. 2a.

DETAILED DESCRIPTION OF THE INVENTION

A supplying and exhausting system in accordance with the present invention is characterized that the plasma polymerizing apparatus which can move the substrate continuously has a polymerizing chamber in which the gas inlet and outlet are installed so that the reactive gas flows in substantially parallel with the moving direction of the substrate.

The present invention can be applied to a case that the substrate moves in parallel as well as to a case of a vertical chamber (a polymerizing chamber in which the substrate moves vertically), which will be described.

As an embodiment of the present invention, the gas inlet is positioned near the substrate inlet of the polymerizing chamber and the gas outlet is positioned near the substrate outlet of the polymerizing chamber. In addition, as another embodiment of the present invention, the gas inlet is positioned near the substrate outlet of the polymerizing chamber and the gas outlet is positioned near the substrate inlet of the polymerizing chamber.

Also, the present invention provides a supplying and exhausting system for a plasma polymerizing apparatus having a post-processing chamber and post-processing chamber which respectively have a gas inlet and gas outlet and in the system, the gas outlet is positioned between the two chambers.

In the system, the gas inlet is positioned in the same direction of the flow of the substrate at the entrance portion of the polymerizing chamber and the post-processing is positioned in the opposite direction of the flow of the substrate at the exit portion of the chamber. The gas flown from the gas outlet of the two chambers flows via an exhaust duct and a throttle valve and is sucked to a pump to be controlled as a whole.

Figure 1:
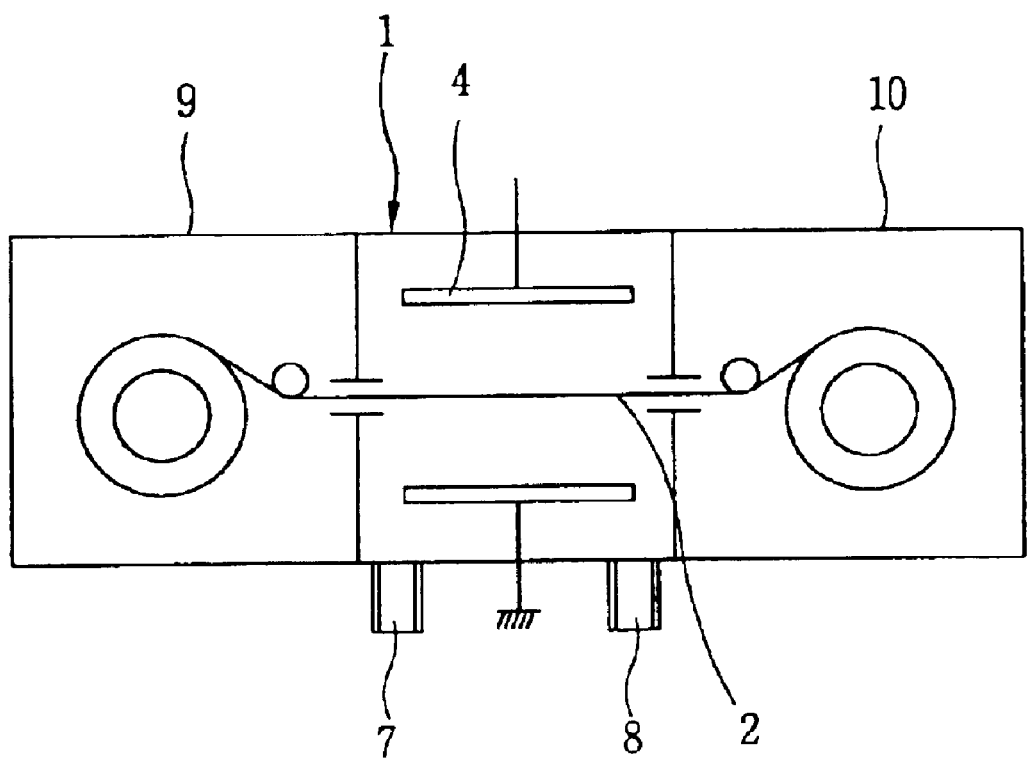
FIG. 1 is a sectional view showing a conventional plasma continuous processing apparatus.
Figure 2A:
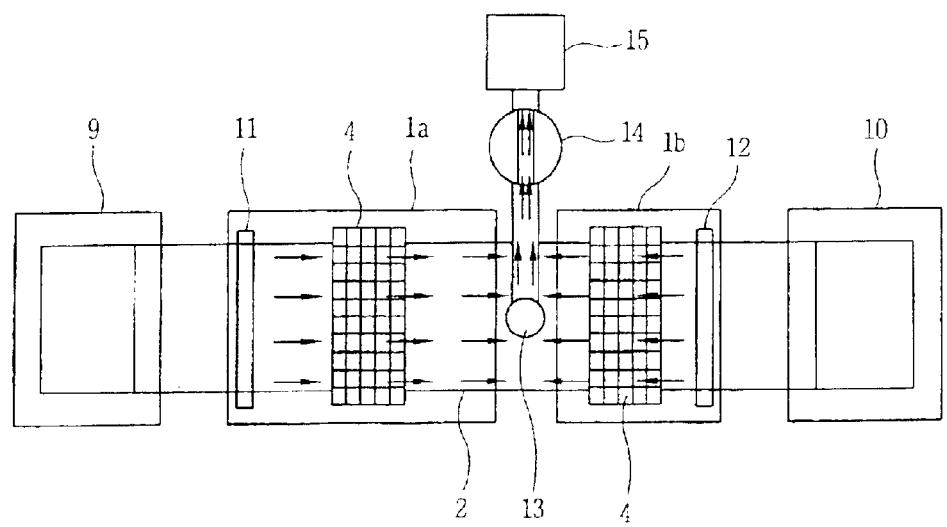
FIG. 2a is a plan view showing a supplying and exhausting system for plasma polymerizing apparatus in accordance with the present invention.

FIG. 2a is a plan view showing an embodiment of the present invention. On the left, an unwinding chamber 9 for unwinding the substrate which is in the status of a roll to a form of sheet is positioned and a polymerizing chamber 1a is fed from the unwinding chamber to perform plasma polymerizing processing. Beside the polymerizing chamber, a post-processing chamber 1b is installed and the substrate is continuously post-processed. Here, secondary plasma polymerizing processing of the substrate or a processing for improving the quality of the substrate can be done. The substrate passed through the post-processing chamber is rewound to be a roll status in the winding chamber 10 on the right. The polymerizing chamber 1a and post-processing chamber 1b respectively have the gas inlets 11, 12 and gas outlets which are references numeral and formed on the wall of the chamber. In case of the polymerizing chamber, the gas inlet is positioned at the entrance portion so that gas is supplied and exhausted in the same direction of the flow of the substrate of the polymerizing chamber and the gas outlet is positioned at the exit portion of the polymerizing chamber. On the other hand, in case of the post-processing chamber, the gas inlet 12 is positioned at the exit portion of the chamber so that the gas is supplied in the opposite direction of the flow of the substrate and the gas outlet is positioned at the entrance portion of the post-processing chamber. With the arrangement, the gas is supplied in the polymerizing chamber and post-processing chamber and the arrangement can control the supply of the two chambers as a whole. The gas from the outlet is flown to the pump 15 through the throttle valve 14.

Figure 2B:
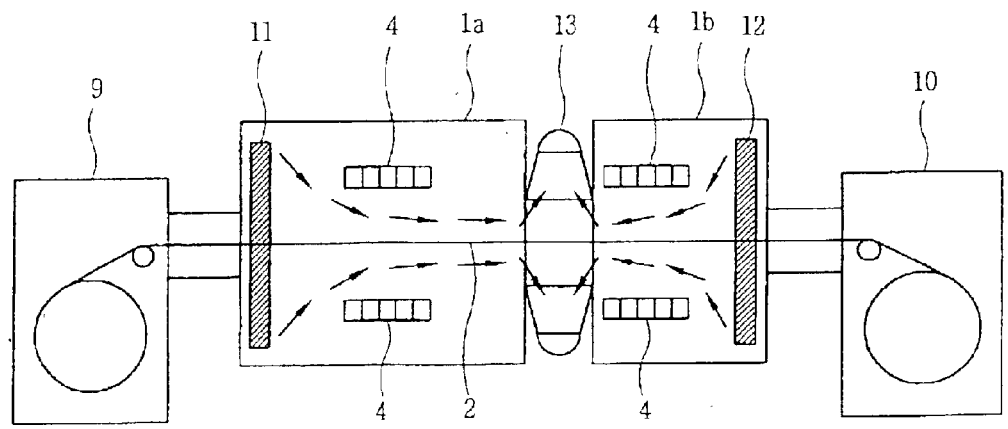

FIG. 2b is a front sectional views showing a supplying and exhausting system of FIG. 2a. The gas supplied from the gas inlets of the polymerizing chamber 1a and post-processing chamber 1b reacts with the substrate 2 which moves between electrodes 4 in the parallel direction and is sucked to the exhaust duct 13 through the exhaust port which is not shown in the drawings.

The exhaust system controls the gas not to be agitated between each chamber in case of continuous plasma polymerizing and gas in each chamber can be controlled simultaneously with a pump. Accordingly, the equipment is simplified and the management is facilitated.

The apparatus described above is composed as a single body. However, for more efficient continuous plasma polymerizing, it is desirable that the apparatus has a number of polymerizing chambers. Particularly, in case the plasma polymerizing apparatus includes a polymerizing chamber having an area in which the motion of the substrate flows vertically, supply and flowing direction and exhaust of the raw gas are very important to enable surface coating processing of good quality.

As another embodiment of the present invention, a supplying and exhausting system which includes at least one polymerizing chamber in which the substrate is fed continuously and coated is provided. Also, in the plasma polymerizing apparatus, at least a polymerizing chamber is installed in the vertical direction of the flow of the substrate and the system includes the gas inlet and outlet which are positioned so that the gas flows in parallel with the flowing direction of the substrate positioned in the polymerizing chamber.

In case the polymerizing chamber has an area which flows in the vertical direction of the flow of the substrate, to make the flowing direction of the raw gas and the substrate in parallel, a specific composition is necessary to compose the supplying and exhausting system for a plasma polymerizing apparatus. Particularly, the gas inlet and outlet are needed to be positioned properly considering the influence to gravity.

Figure 3A:
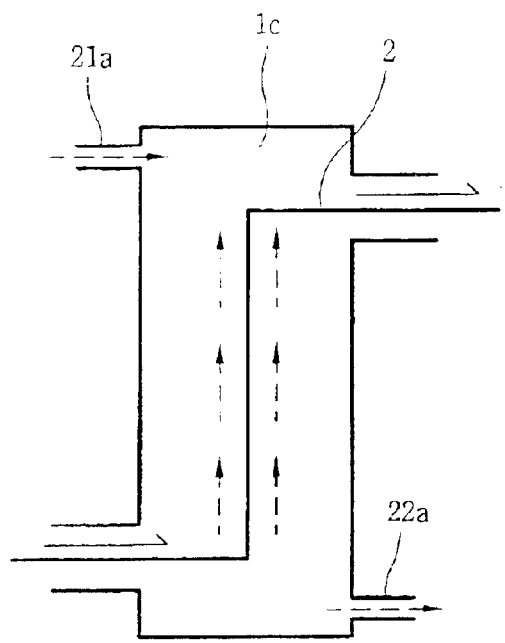
FIG. 3a shows an embodiment of the supplying and exhausting system in the vertical chamber.
Figure 3B:
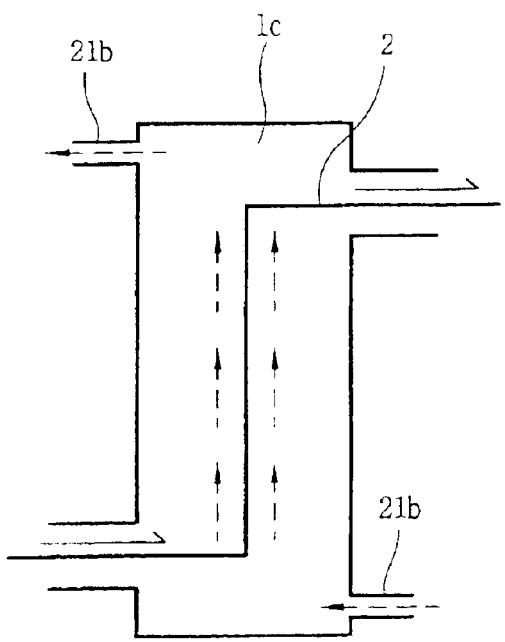
FIG. 3b shows another embodiment of the supplying and exhausting system in the vertical chamber.

FIG. 3a shows the polymerizing chamber, which has an area in which the substrate flows vertically. The substrate 2 flows from the lower portion to the upper potion of the polymerizing chamber and the gas inlet 21a for supplying raw gas, that is, reactive gas and unreactive gas is installed on one end surface of the upper portion of the polymerizing chamber 1c. The gas outlet portion 22a for discharging the raw gas is installed on an end surface of the lower portion of the polymerizing chamber. Namely, the raw gas discharged from the gas inlet moves in the opposite direction of the flow of the substrate in parallel and is discharged through the gas outlet. FIG. 3b shows a case that the substrate and the gas flow in the same direction by installing the gas inlet 21b and gas outlet of FIG. 3a in the opposite direction. In this case, the characteristic of the raw gas flow on the surface of the substrate 2 is changed to be different from the characteristic in FIG. 3a and accordingly, plasma polymerizing process according to the characteristic can be performed.

Figure 4A:
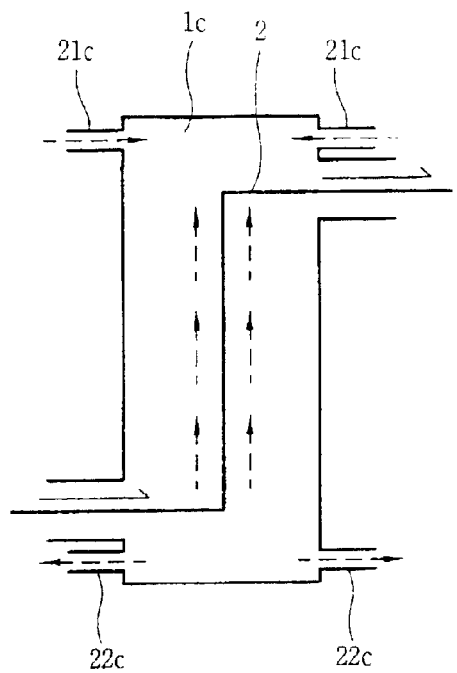
FIG. 4a shows still another embodiment of the supplying and exhausting system in the vertical chamber.
Figure 4B:
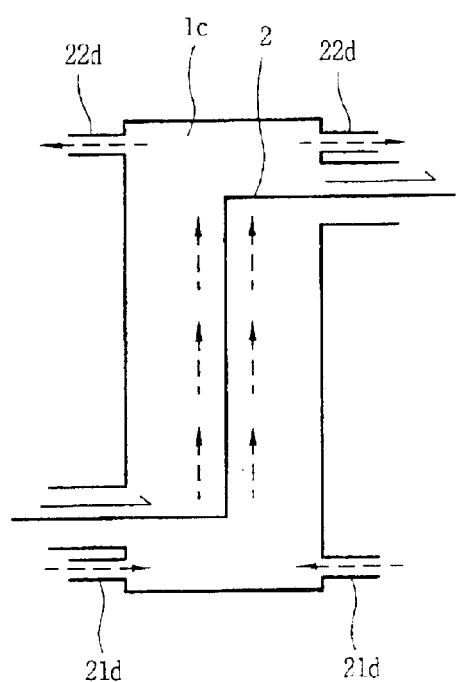
FIG. 4b shows yet another embodiment of the supplying and exhausting system in the vertical chamber.

FIGS. 4a and 4b are sectional view showing an embodiment in which the gas inlet and the gas outlet are installed on the both surfaces of the vertical-polymerizing chamber. In FIG. 4a, the gas inlet 22c is installed on the both end surfaces of upper portion of the vertical chamber and the gas outlet 21c is installed on the both end surfaces of the lower portion of the vertical chamber so that the substrate 2 and gas flow in the opposite direction. In FIG. 4b, the gas inlet 21d is installed in the lower portion of the vertical chamber and the gas outlet 22d is installed in the upper portion of the vertical chamber so that the substrate 2 and gas flow in the same direction. Therefore, the amount of the raw gas flow increases to become more than the amount of the raw gas supply and exhaust and more uniform by installing respectively a gas inlet and a gas outlet thus to perform surface processing swiftly with a good quality.

Figure 5A:
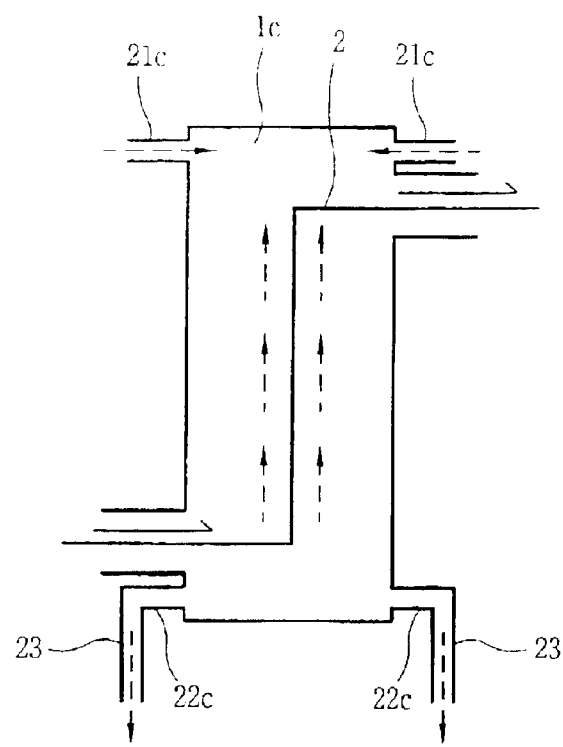
FIG. 5a shows the supplying and exhausting system, which includes additional gas outlet channels.
Figure 5B:
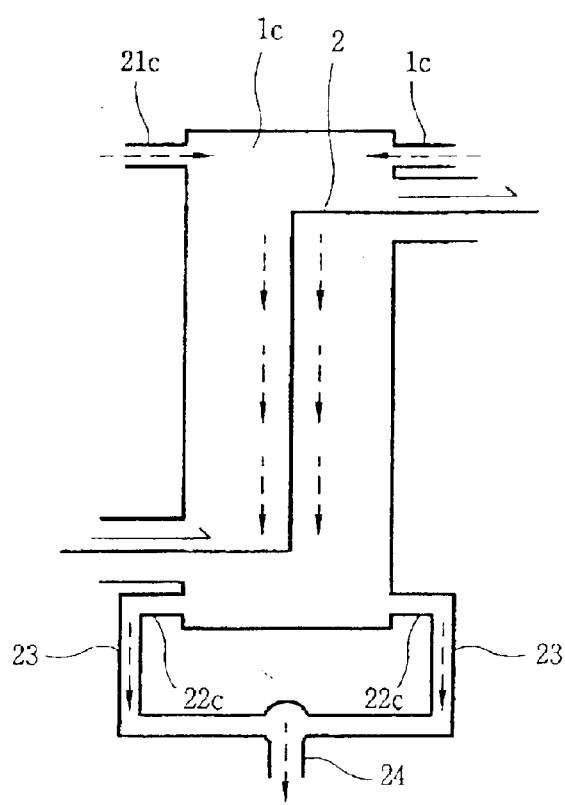
FIG. 5b shows the supplying and exhausting system, which includes an additional junction unit for unifying the gas outlet channels.

Also, in the present invention as shown in FIG. 5a, the gas outlet channel 23 connected to the gas outlet can be included additionally and as shown in FIG. 5b, a junction area 24 for unify at least one gas outlet channel 23. By installing the gas outlet channel in the gas outlet, the shape of the channel can be adjusted and the processing of the discharged gas can be facilitated. Particularly, in case the system includes a number of polymerizing chambers, the discharged gas can be processed with the junction area as a whole. FIGS. 5a and 5b describe about the vertical chamber. However, the description can be applied to the polymerizing chamber identically.

The supplying and exhausting system in accordance with the present invention can achieve a uniform surface processing of good quality and control the amount of the gas supply and exhaust easily by adjusting the gas flow in parallel with the flow of the substrate even in case the plasma polymerizing apparatus having a number of polymerizing chambers has an area in which the substrate flows vertically in the polymerizing chamber.

Industrial Applicability

As so far described, according to the present invention, the gas inlet and outlet is positioned so that the gas flows in substantially parallel with the moving direction of the substrate in the polymerizing chamber in which the motion of the substrate is performed in the parallel or vertical direction and accordingly, sufficient reaction is capable due to the long time duration of contact of the substrate and the reactive gas thus to achieve the substrate having a great effect of polymerizing process. In addition, the present invention can control the gas in the polymerizing chamber to be formed near the substrate and accordingly the reactive gas can be used efficiently thus to reduce cost to make the gas flow uniformly. Also, in the plasma polymerizing apparatus respectively having a polymerizing chamber and a post-processing chamber, the present invention provides a simpler supplying and exhausting system and accordingly, gas supply and exhaust can be controlled smoothly so that the gas is agitated in between the respective chambers. In addition, space for installation can be reduced since the gas in each chamber can be simultaneously controlled.

What is claimed is:

1. A supplying and exhausting system for a plasma polymerizing apparatus in which a substrate moves continuously comprises
    a gas inlet for supplying gas to a polymerizing chamber, and
    a gas outlet for exhausting reactive gas supplied through the gas inlet,
    wherein the gas inlet and outlet are installed in such a way that the reactive gas flows in substantially parallel with the moving direction of the substrate.

2. The system of claim 1, wherein the substrate moves horizontally in the polymerizing chamber.

3. The system of claim 2, wherein the gas inlet is positioned near a substrate inlet of the polymerizing chamber and the gas outlet is positioned near a substrate outlet of the polymerizing chamber.

4. The system of claim 2, wherein the gas inlet is positioned near a substrate outlet of the polymerizing chamber and the gas outlet is positioned near a substrate inlet of the polymerizing chamber.

5. The system of claim 2, wherein an additional post-processing chamber is installed beside the polymerizing chamber and the polymerizing chamber and post-processing chamber respectively have a gas inlet and gas outlet, wherein the gas outlet is positioned between the two chambers.

6. The system of claim 5, wherein the gas inlet is positioned in the same direction of the flow of the substrate at an entrance portion of the polymerizing chamber and the gas outlet is positioned in the opposite direction of the flow of the substrate at an exit portion of the post-processing chamber.

7. The system of claim 5, having only one pump for a unified controlling the gas flown from the gas outlet of the polymerizing chamber and the post-processing chamber.

8. The system of claim 1, wherein the polymerizing chamber comprises a number of chambers and at least one of the chambers has an area where the substrate moves in the vertical direction.

9. The system of claim 8, wherein the gas inlet is positioned on an upper end surface or a lower end surface of the chamber having an area where the substrate moves in the vertical direction and the gas outlet is positioned on an end surface opposite to the gas inlet.

10. The system of claim 8, wherein the gas inlet is positioned on both upper end surfaces or both lower end surfaces of the chamber having an area where the substrate moves in the vertical direction and the gas outlet is positioned on the both surfaces opposite to the gas inlet.

11. The system of claim 10 having additional gas outlet channels connected to the gas outlet.

12. The system of claim 11 having a junction unit for unifying the gas outlet channels.

13. A supplying and exhausting system for a plasma polymerizing apparatus in which a substrate moves continuously comprises
    a gas inlet for supplying gas to a polymerizing chamber, and
    a gas outlet for exhausting reactive gas supplied through the gas inlet,
    wherein the substrate moves horizontally in the polymerizing chamber and the gas inlet and outlet are installed in such a way that the reactive gas flows in substantially parallel with the moving direction of the substrate.

14. The system of claim 13, wherein the substrate moves in the parallel direction and the gas supplied to the polymerizing chamber flows in substantially parallel with the moving direction of the substrate.

15. The system of claim 14, wherein the gas inlet is positioned in an entrance portion of the polymerizing chamber in the same direction as the flow of the substrate and positioned in an exit portion of the post-processing chamber in the opposite direction to the flow of the substrate.

16. The system of claim 15, having a pump for controlling the gas flown from the gas outlet of the polymerizing chamber and post-processing chamber and the post-processing chamber.

17. The system of claim 13, wherein the gas inlet is positioned near an inlet portion of the polymerizing chamber and the gas outlet is positioned near an outlet portion of the substrate of the polymerizing chamber.

18. The system of claim 13, having an additional post-processing chamber and wherein the polymerizing chamber and the post-processing chamber respectively have a gas inlet and gas outlet which is positioned between the two chambers.

19. A supplying and exhausting system for a plasma polymerizing apparatus in which a substrate moves continuously comprises
    a gas inlet for supplying gas to a polymerizing chamber, and
    a gas outlet for exhausting reactive gas supplied through the gas inlet,
    wherein the substrate moves in the vertical direction in the polymerizing chamber and the gas inlet and outlet are installed in such a way that the reactive gas flows in substantially parallel with the moving direction of the substrate.

20. The system of claim 19, wherein the gas inlet is positioned on an upper end surface or a lower end surface of the polymerizing chamber and the gas outlet is positioned on an end surface opposite to the gas inlet.

21. The system of claim 19, wherein the gas inlet is positioned on both upper end surfaces or both lower end surfaces of the polymerizing chamber and the gas outlet is positioned on both surfaces opposite to the gas inlet.

22. The system of claim 19, additionally having gas outlet channels connected to the gas outlet.

23. The system of claim 22, having a junction unit for unifying the gas outlet channels.

* * * * *